(12) United States Patent
Calisch et al.

(10) Patent No.: US 12,124,784 B2
(45) Date of Patent: Oct. 22, 2024

(54) PRECISION PLANAR COIL PLACEMENT FOR THREE-DIMENSIONAL INDUCTIVE SENSORS

(71) Applicant: Massachusetts Institute of Technology, Cambridge, MA (US)

(72) Inventors: Samuel E. Calisch, Cambridge, MA (US); Neil A. Gershenfeld, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 929 days.

(21) Appl. No.: 16/883,434

(22) Filed: May 26, 2020

(65) Prior Publication Data
US 2020/0387657 A1    Dec. 10, 2020

Related U.S. Application Data

(60) Provisional application No. 62/852,731, filed on May 24, 2019.

(51) Int. Cl.
G06F 30/392 (2020.01)
G01D 5/22 (2006.01)
H01F 41/086 (2016.01)

(52) U.S. Cl.
CPC ......... *G06F 30/392* (2020.01); *G01D 5/2291* (2013.01); *H01F 41/086* (2016.01)

(58) Field of Classification Search
CPC .... H01P 3/16; H01P 3/10; H03H 7/40; G01R 29/0842; H01B 1/00; H01B 11/1895;

(Continued)

(56) References Cited

U.S. PATENT DOCUMENTS 3,674,914 A    7/1972  Burr
5,954,909 A *  9/1999  Davidsohn .............. H01F 41/12
                                                        156/293

(Continued)

FOREIGN PATENT DOCUMENTS

WO    2015/185879 A1    12/2015

OTHER PUBLICATIONS

Hagedorn et al., "Handbook of Coil Winding: Technologies for efficient electrical wound products and their automated production", 2018, 299 pages. [Abstract Only].

(Continued)

*Primary Examiner* — Binh C Tat
(74) *Attorney, Agent, or Firm* — Dunlap Bennett & Ludwig, PLLC (57) ABSTRACT

A method of producing inductive sensors, including LVDTs and inductive encoders, manufactured by plotting fine wire onto a planar substrate. A sensor is constructed using a computer-controlled machine to place wire onto a planar adhesive substrate. This substrate forms a predictable and uniform surface to deposit each turn of wire, and so the placement accuracy is considerably better than conventional coil winding. This planar substrate can then be manipulated into a desired three-dimensional shape (e.g., by folding, rolling, corrugating, winding, etc.), carrying the wire along with it. In particular, the same CNC machine used to place the wire can be used to cut, crease, score, or otherwise pattern the substrate to facilitate the three-dimensional arrangement.

20 Claims, 14 Drawing Sheets

(58) Field of Classification Search
CPC .. H02J 50/12; H02J 50/60; H02J 50/70; H02J 50/80; H02J 50/90; H02J 50/50; H02J 7/0047; H02J 7/00304; H02J 7/00309; H02J 50/10; H02J 50/502; H02J 50/005; H02J 50/05; H02J 7/0029; H02J 50/40; H02J 50/402; H02J 7/35; H02J 2310/48; H02J 7/00; H02J 7/00034; H02J 7/00045; H02J 2310/40; H02J 3/322; H02J 50/20; H02J 13/00022; H02J 13/00028; H02J 2207/40; H02J 2310/23; H02J 3/00125; H02J 50/23; H04B 1/18; H04B 15/04; H04B 7/06; H01F 38/14; H01F 27/24; H01F 27/28; H01F 6/06; H01F 17/0033; H01F 17/062; H01F 2027/2809; H01F 2027/2814; H01F 2027/2819; H01F 27/027; H01F 27/2804; H01F 27/2895; H01F 27/30; H01F 27/34; H01F 27/40; H01F 41/02; H01F 41/0206; H01F 41/041; H01F 41/042; H01F 41/064; H01F 5/00; H01F 2003/005
USPC .......................... 716/100–106; 345/420–427
See application file for complete search history.

(56) References Cited

U.S. PATENT DOCUMENTS

| | | | |
|---|---|---|---|
| 7,705,585 B2 | 4/2010 | Howard | |
| 9,797,490 B2* | 10/2017 | Marvin | F16H 25/205 |
| 9,812,246 B1* | 11/2017 | Nunez | H01F 27/29 |
| 9,945,653 B2 | 4/2018 | Howard et al. | |
| 2009/0174396 A1* | 7/2009 | Howard | G01D 5/2053 |
| | | | 324/207.24 |
| 2009/0309578 A1* | 12/2009 | Cochran | A61B 5/1126 |
| | | | 336/84 R |
| 2010/0001718 A1* | 1/2010 | Howard | G01B 7/003 |
| | | | 324/207.15 |
| 2015/0369886 A1* | 12/2015 | Menon | G01R 33/365 |
| | | | 324/322 |
| 2019/0131060 A1* | 5/2019 | Mo | H01F 27/26 |

OTHER PUBLICATIONS

Papoutsidakis et al., "Rotation Sensors—A Brief Guide of Use of the Most Common Types", International Journal of Computer Applications (0975-8887), vol. 179—No. 30, Mar. 2018, 7 pages.

Calisch et al., U.S. Appl. No. 16/178,643 entitled "Differential Magnetic Load Cells for Compact Low-Hysteresis Force and Torque Measurements", filed Nov. 2, 2018, 27 pages.

Cambridge Integrated Circuits Ltd, "360° End-Shaft Resonant Inductive Sensor", retrieved on Feb. 17, 2021, pp. 9. available at: https://www.cambridgeic.com/images/downloads/033-0002_0004_(Rotary_Sensor).pdf.

Ruhle Companies, Inc., retrieved on Feb. 17, 2021, pp. 2. available at: http://www.inductosyn.com/.

Zettlex Inductive Encoders, "Inductive Sensors—A Guide", retrieved on Feb. 17, 2021, p. 5. available at: https://www.celeramotion.com/zettlex/support/technical-papers/inductive-sensors/.

Zettlex Inductive Encoders, "IncOder™ Inductive Angle Encoders", retrieved on Feb. 17, 2021, pp. 5. available at: https://www.celeramotion.com/zettlex/support/technical-papers/inductive-sensors/.

Cambridge Integrated Circuits Ltd, "Technology", retrieved on Feb. 17, 2021, pp. 7.

* cited by examiner

PRECISION PLANAR COIL PLACEMENT FOR THREE-DIMENSIONAL INDUCTIVE SENSORS

This application is related to, and claims priority from, U.S. Provisional Patent Application No. 62/852,731 filed May 24, 2019. Application 62/852,731 is hereby incorporated by reference in its entirety.

This invention was made with Government support under contract number W911NF-16-1-0568 awarded by the Army Research Office. The Government has certain rights in the invention.

BACKGROUND

Field of the Invention

The present invention relates generally to the field of inductors and inductive sensors and more generally to the problem of precision planar coil placement for 3-D inductive sensors.

Description of the Problem Solved

A Linear Variable Differential Transformer (LVDT) is an electromechanical sensor or device used to convert mechanical motion or vibrations, specifically rectilinear motion, into a variable electrical current, voltage or electric signals, and the reverse. Usually, the LVDT is constructed as a hollow metallic cylinder in which a shaft of smaller diameter moves freely back and forth along the cylinder's long axis. The shaft, or pushrod, ends in a magnetically conductive core which is within the cylinder, or coil assembly when the device is operating. The pushrod is typically physically attached to the moveable object whose position is to be determined, while the coil assembly is usually attached to a fixed reference point.

Such sensors are commonly used to sense the position of a mechanical actuators, including motors, hydraulic servo valves, and instrumentation equipment. In particular, they are commonly used in harsh environments as their construction and measurement is robust against extreme thermal and pressure cycling as well as exposure to liquids, dust, and other contaminants. One of their key uses is to robustly measure the position of control surfaces on airplanes.

LVDTs and other inductive sensors are conventionally made by coil winding, where a bobbin rotates and insulated conductive wire (generally copper or aluminum) is wrapped onto it. In this process, it is difficult to control exact placement of individual turns of wire because misplacing a single turn causes a cascade of misplaced wires as more turns are added on top of the original mistake. The result is a drastic reduction in packing density due to crossing wires. Further, these crossing points can create regions of high stress in the wire and can become a point of failure during operation. In particular, in applications subject to thermal and humidity cycling, the insulation can short and the wire can break, causing premature failure of the entire device.

SUMMARY OF THE INVENTION

The present invention relates to 3-dimensional inductors including inductive sensors such as LVDTs and inductive encoders manufactured by plotting fine wire onto a planar substrate using a plotter or other computer-controlled CNC machine or device. A sensor is constructed using the computer-controlled machine to place thin wire onto a planar adhesive substrate. This substrate forms a predictable and uniform surface to deposit each turn of wire, and so the placement accuracy is considerably better than conventional coil winding. This planar substrate can then be manipulated into a desired three-dimensional shape (e.g., by folding, rolling, corrugating, winding, etc.), carrying the wire along with it. In particular, the same CNC machine used to place the wire can be used to cut, crease, score, or otherwise pattern the substrate to facilitate the three-dimensional arrangement. This method of coil plotting can be performed at speeds of several meters per second, which is similar to high speed conventional coil winding, but with greater accuracy.

DESCRIPTION OF THE FIGURES

Several figures are now presented to illustrate features of the present invention.

Illustrations are provided to aid in understanding the present invention. The scope of the present invention is not limited to what is shown in the figures.

DESCRIPTION OF THE PREFERRED EMBODIMENTS

A sensor is constructed using a computer-controlled machine to place wire onto a planar adhesive substrate. This substrate forms a predictable and uniform surface to deposit each turn of wire, and so the placement accuracy is considerably better than conventional coil winding. This planar substrate can then be manipulated into a desired three-dimensional shape (e.g., by folding, rolling, corrugating, winding, etc.), carrying the wire along with it. In particular, the same CNC machine used to place the wire can be used to cut, crease, score, or otherwise pattern the substrate to facilitate the three-dimensional arrangement. This method of coil plotting can be performed at speeds of several meters per second (at least two), which is similar to high speed conventional coil winding (Hagedorn, *Handbook of Coil Winding*), but with greater accuracy.

Figure 1A:
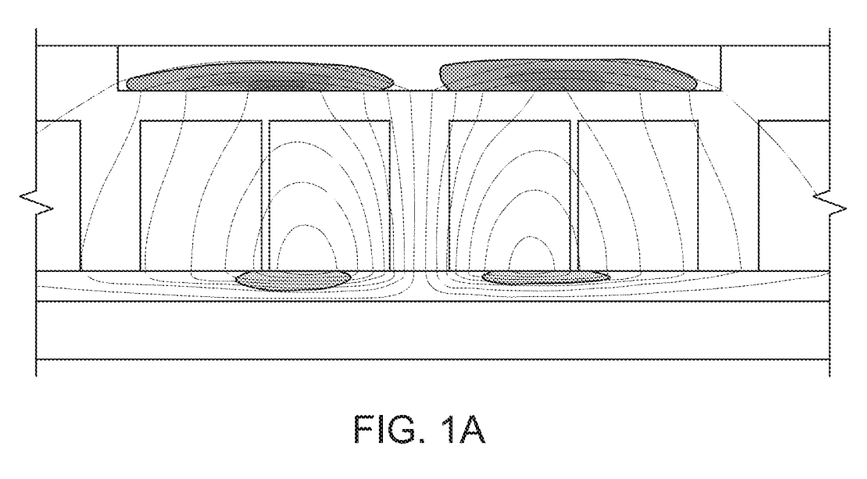
FIGS. 1A-1B show a simulation of magnetic flux in a dual winding LVDT.
Figure 1B:
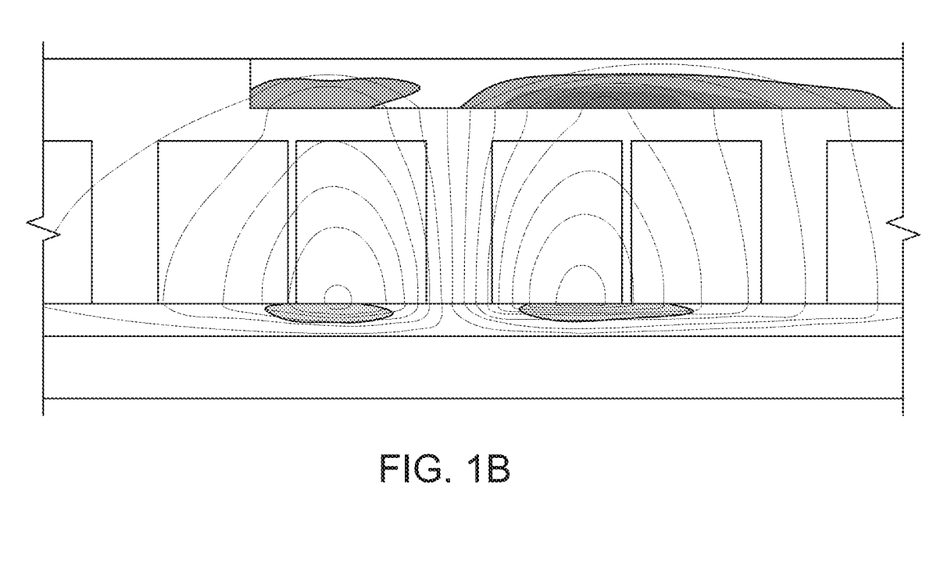
Figure 2:
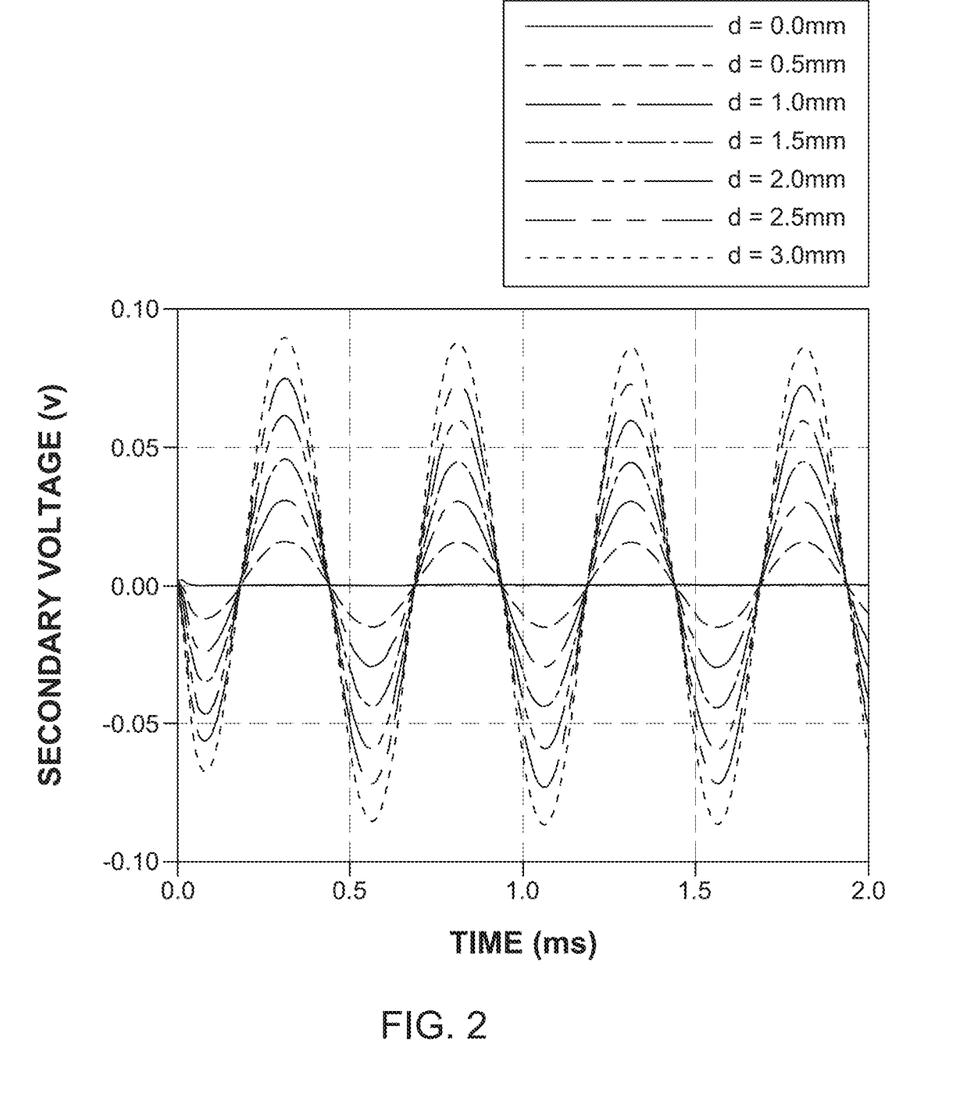
FIG. 2 is a graph of secondary excitation.
Figure 3:
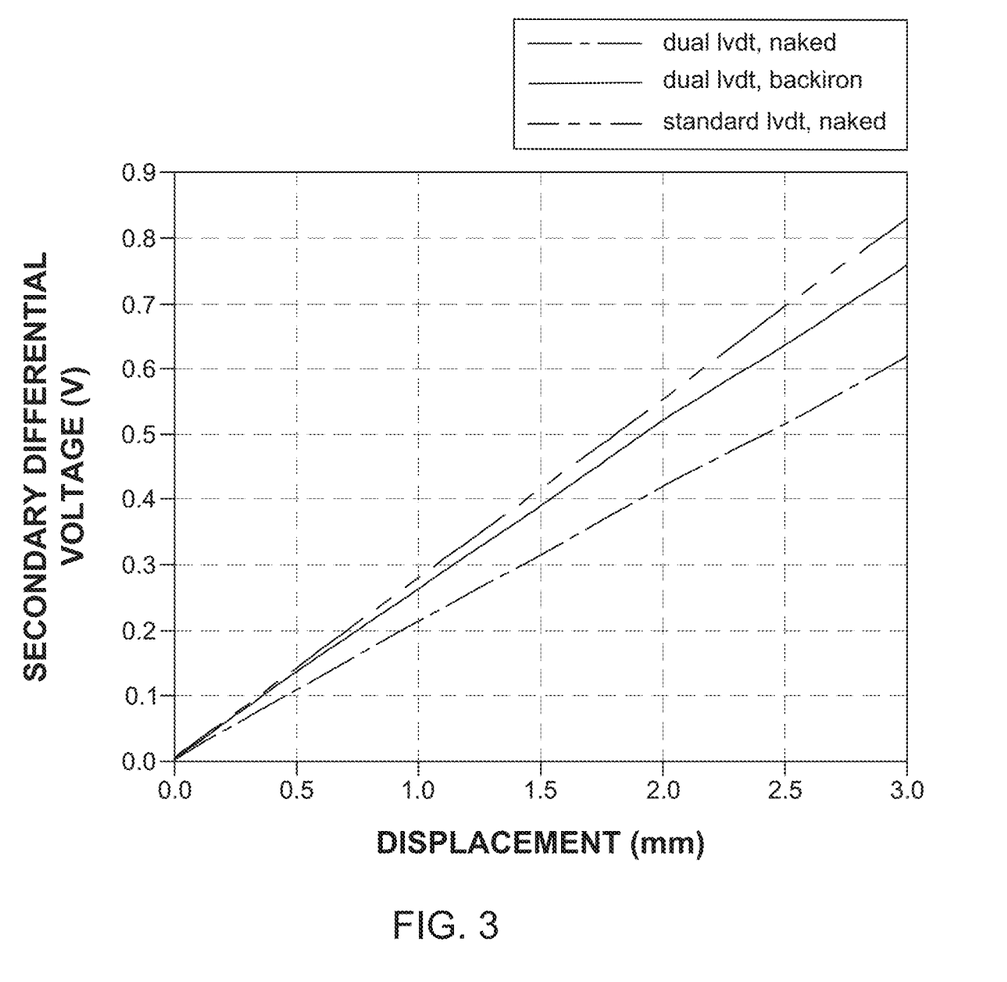
FIG. 3 is a comparison of response vs. displacement with the standard LVDT.

In one embodiment, an LVDT is formed by plotting three planar coils onto a thin film (12 micron kapton—or thinner) using a large format plotter (Zund Systemtechnik G3-L-2500). This pattern is cut out using an oscillating knife on a plotting machine and rolled onto a bobbin using a simple jig and hand drill. The central coil forms the primary, which differentially excites the two other coils (secondaries) based on the position of a ferromagnetic core. A simulation of this configuration is shown in FIGS. 1A-1B, FIG. 2 and FIG. 3. FIGS. 1A-1B show the simulation of the magnetic flux in each of the two secondary windings. FIG. 2 shows the secondary excitation for different diameters. FIG. 3 shows a comparison of the responses of the dual secondary embodiment with the response vs. displacement of a standard LVDT (lowest line on graph).

Figure 4A:
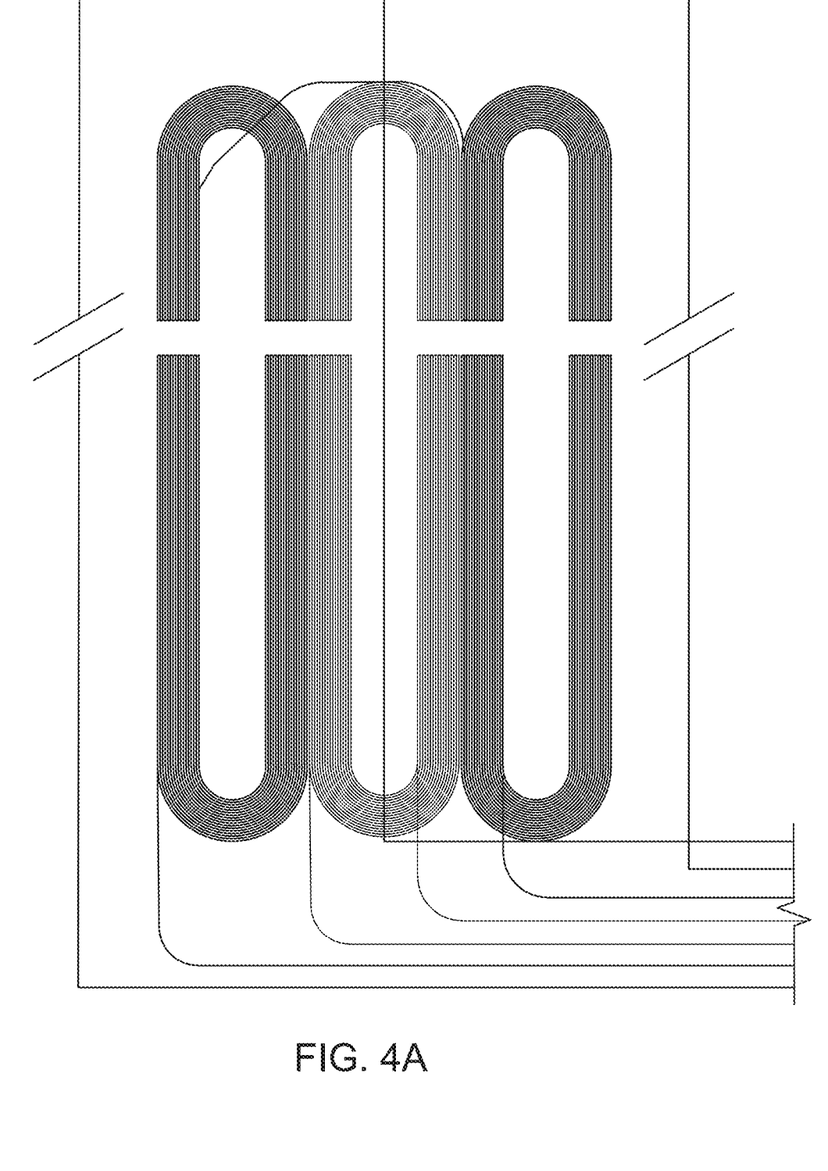
FIG. 4A is a digital design for coil placement in an LVDT.
Figure 4B:
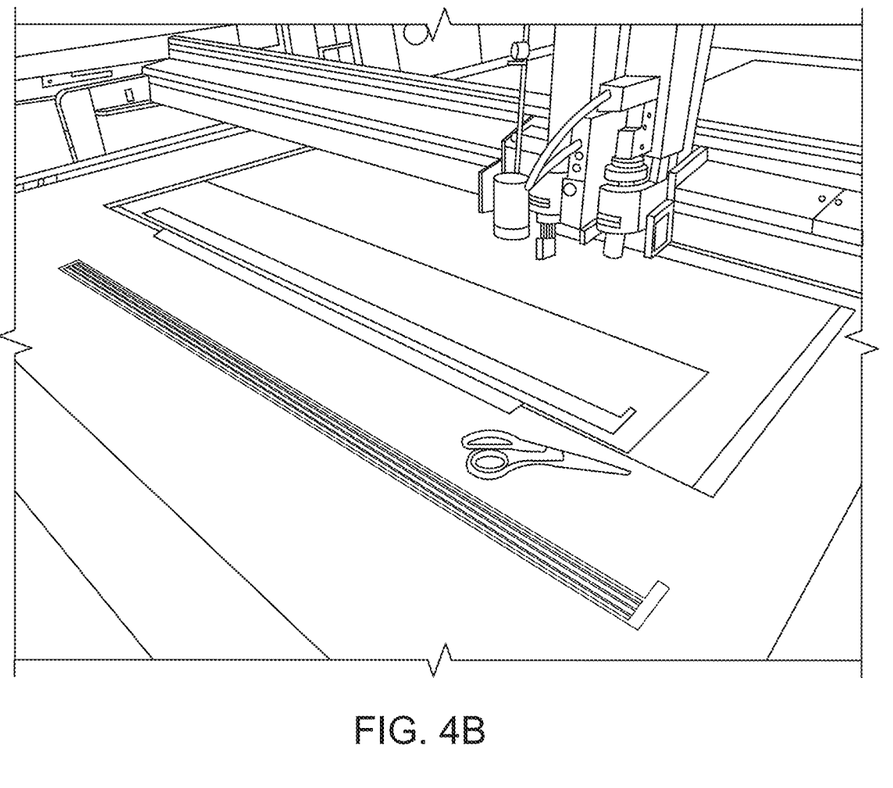
FIG. 4B shows plotting of the coil.
Figure 4C:
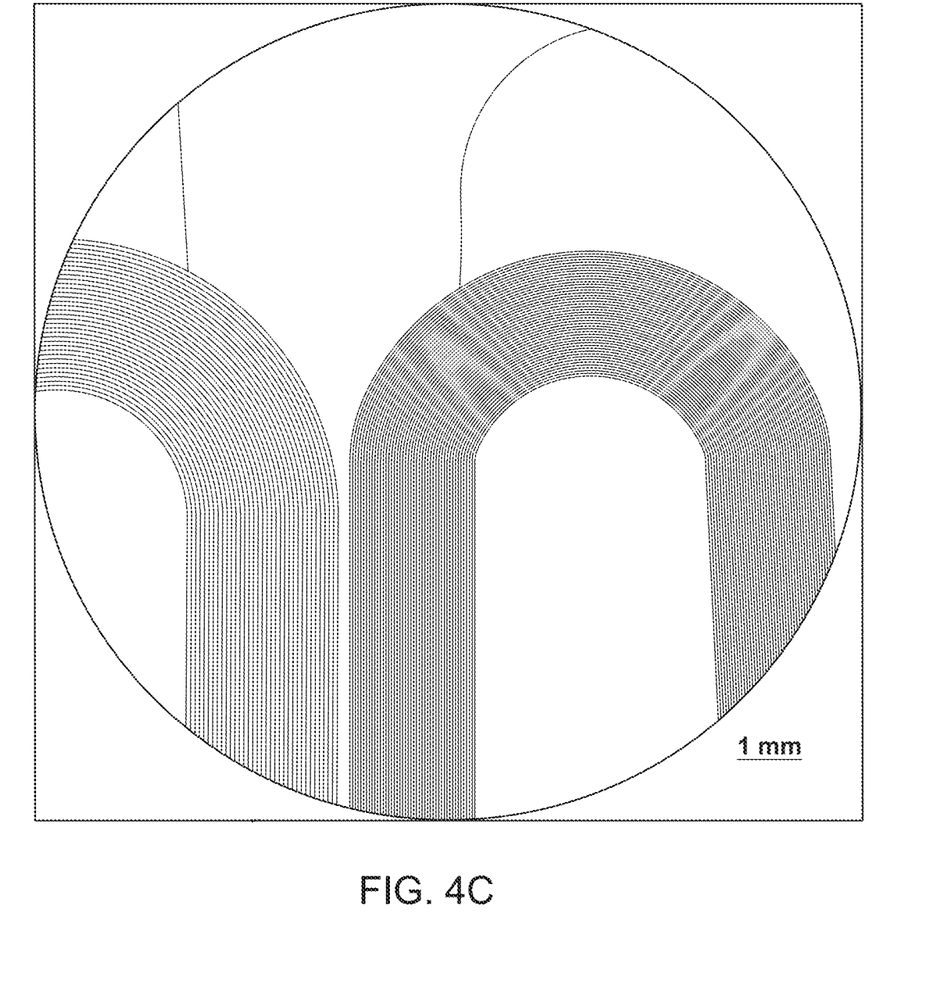
FIG. 4C is a micrograph of coil placement.

FIG. 4A shows the digital design for coil placement in this dual secondary LVDT. FIG. 4B shows the plotted coils, and FIG. 4C is a micrograph of coil placement.

Figure 5A:
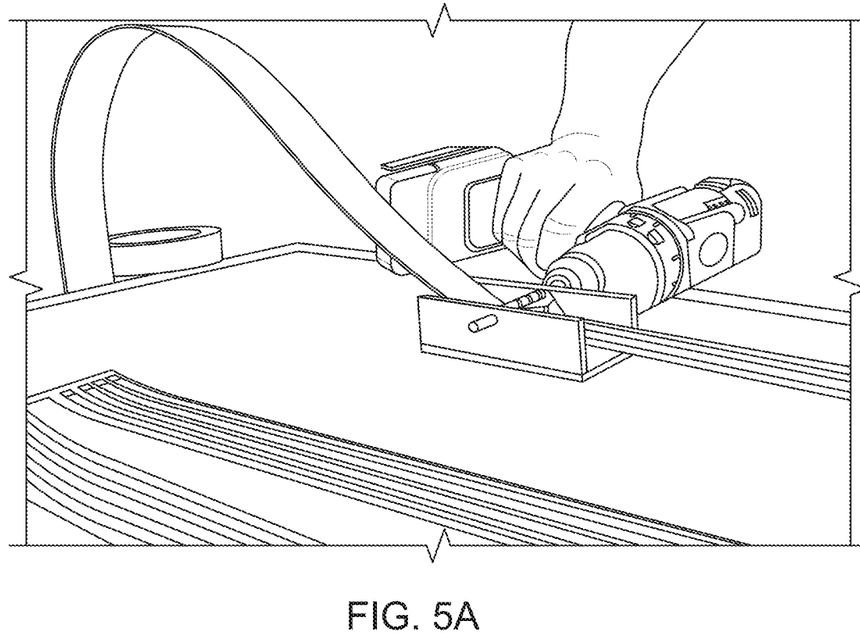
FIG. 5A shows winding the plotted tape.
Figure 5B:
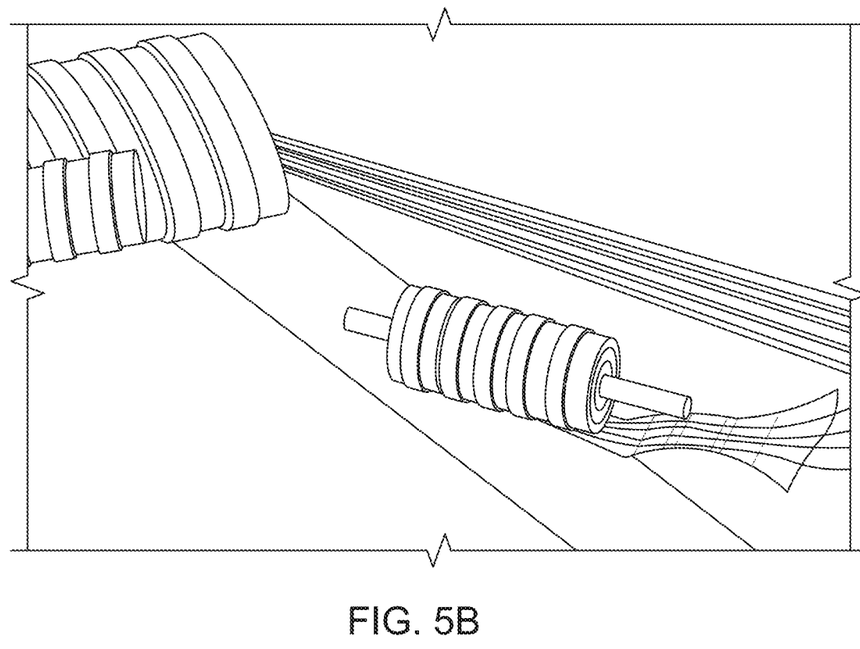
FIG. 5B shows the rolled LVDT.
Figure 6A:
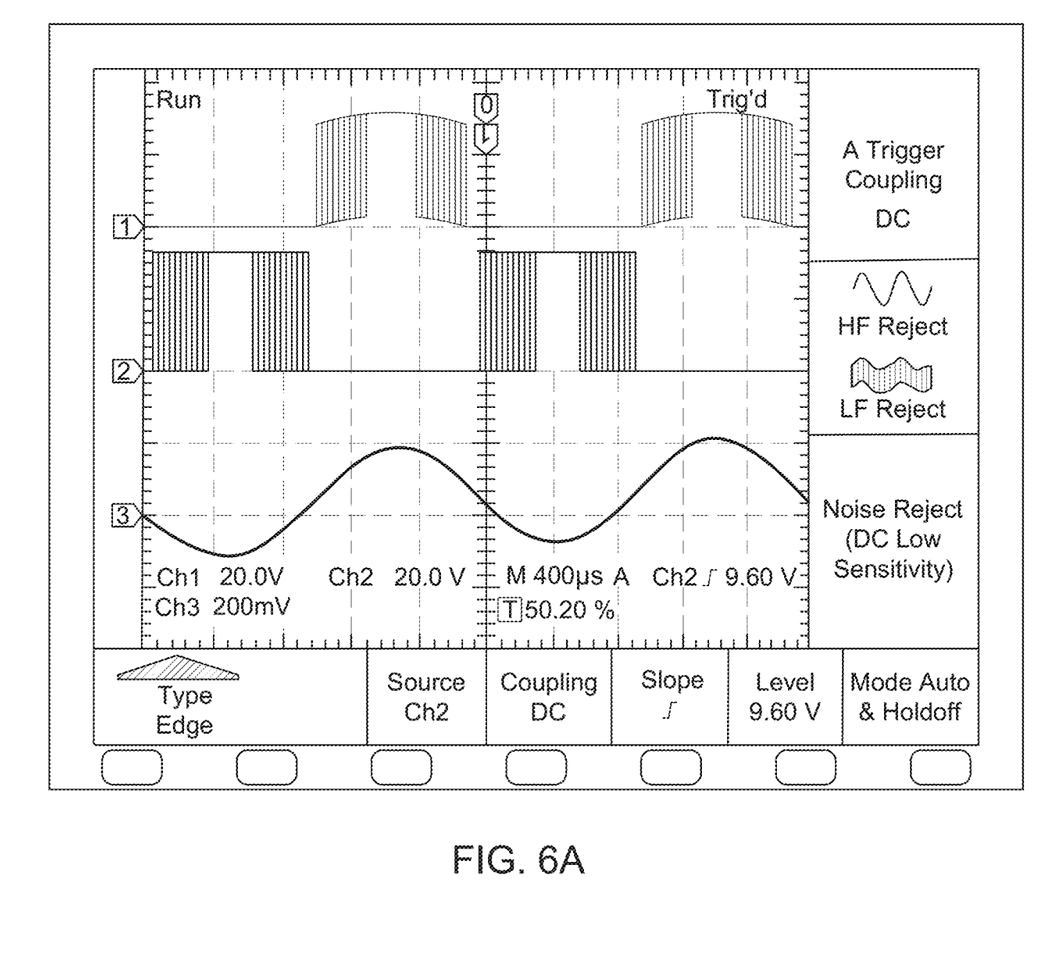
FIG. 6A shows input PWM waveforms and excitation in the secondary at one stroke extreme.
Figure 6B:
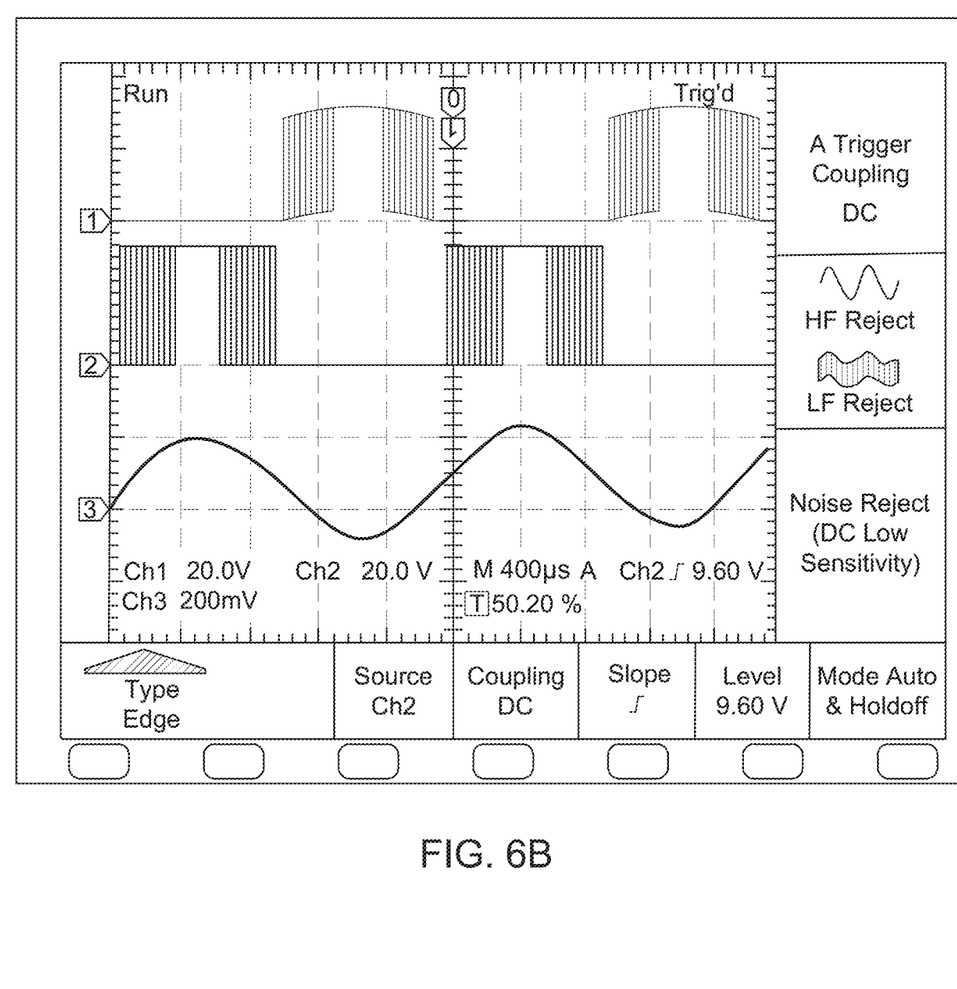
FIG. 6B shows input PWM waveforms and excitation in the secondary at the other stroke extreme.

FIGS. 5A-5B show the winding process and the finished LVDT. FIGS. 6A and 6B show oscilloscope outputs from the two extreme positions of the ferromagnetic core. FIG. 6A is the response in one extreme position, while FIG. 6B is the response in the other extreme position. To make these measurements, a sinusoidal voltage is applied to the primary using pulse width modulation from a MOSFET H-Bridge circuit. The two secondaries are wired in an opposing series configuration, so the voltage difference across their leads is proportional to the time derivative of the difference in flux linkages between the two secondary coils. This demonstrates that the functionality of the LVDT can be achieved using a topology amenable to planar wire plotting. The result is an LVDT with near optimal conductor packing, which increases sensor efficiency, minimizes size, and eliminates spurious wire crossings, which are the source of premature failure of the device in the harsh environments where they are commonly used.

The geometric control made possible by planar plotting can also be used to increase the performance of conventional LVDTs. For instance, the turn density can be varied as a function of position in order to tailor the response of the sensor. This is sometimes done for conventional long-stroke LVDTs to improve linearity, but the accuracy and constraints of conventional coil winding limit the utility of this technique. For instance, in the LVDT shown in FIGS. 4A-4C, the turn density can be varied by changing the horizontal position of the turns, as well as by changing the vertical extent of the turns (effectively reducing the number of wraps of this turn).

Figure 7:
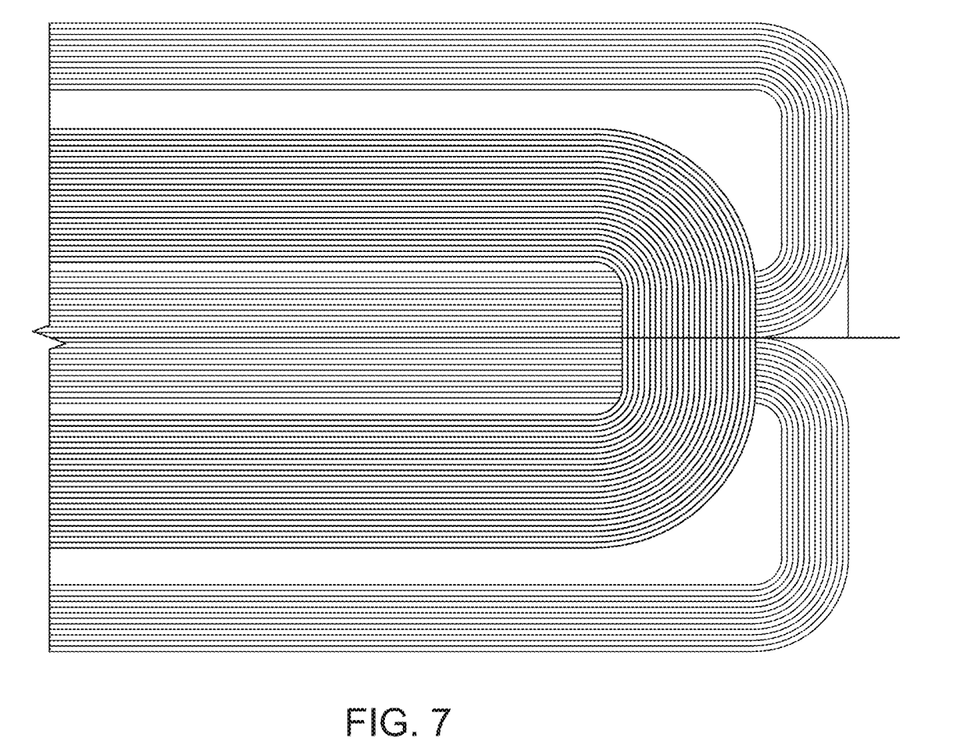
FIG. 7 shows a dense plotted LVDT design with inverted primary and secondary.
Figure 8:
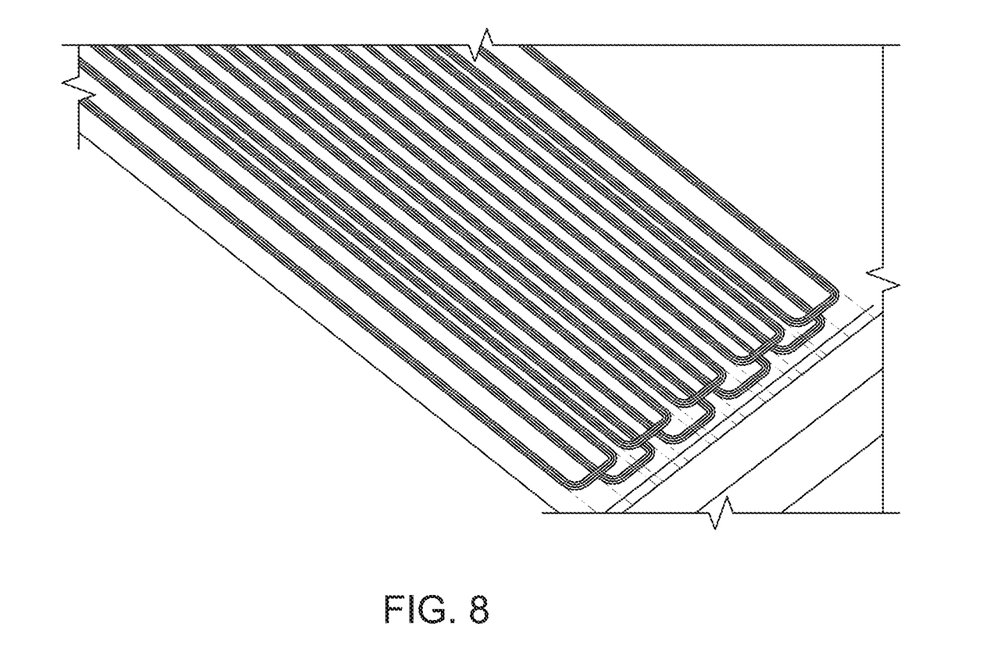
FIG. 8 shows a dense plotted multi-pitch LVDT for extending the range at high resolution.

Alternative LVDT coil topologies can also be plotted in this way. FIG. 7 shows a coil arrangement with primary and secondaries inverted that packs densely. FIG. 8 shows a dense interleaved arrangement of primaries and secondaries that extends the range of the LVDT at high resolution. This arrangement can be considered an LVDT encoder, as absolute positioning certainty is sacrificed for the increased resolution/range. Two such arrangements with coprime number of pitches can be used in tandem to restore absolute positioning, as is common in the construction of absolute encoders.

Figure 9A:
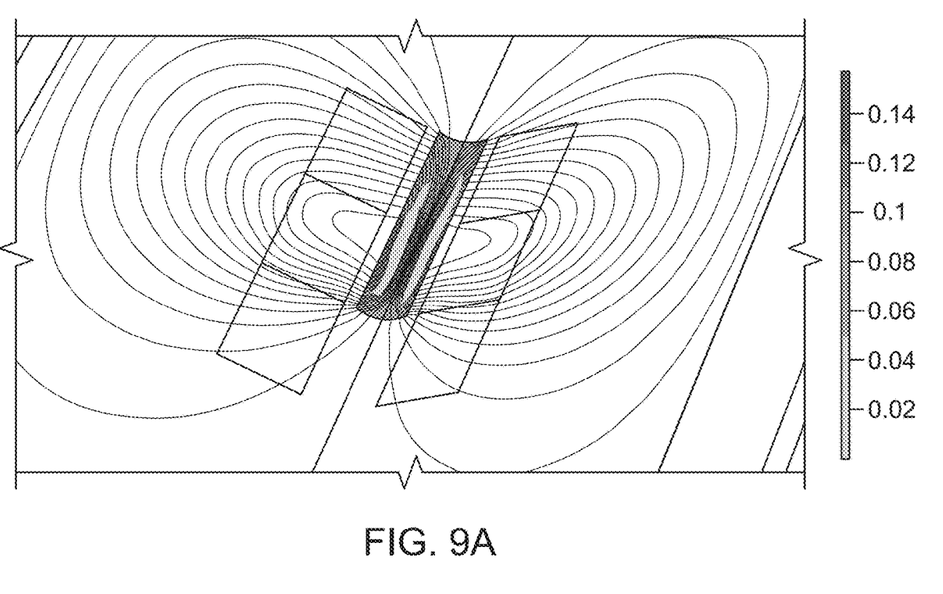
FIG. 9A is a simulation of magnetic flux in a conventional LVDT.
Figure 9B:
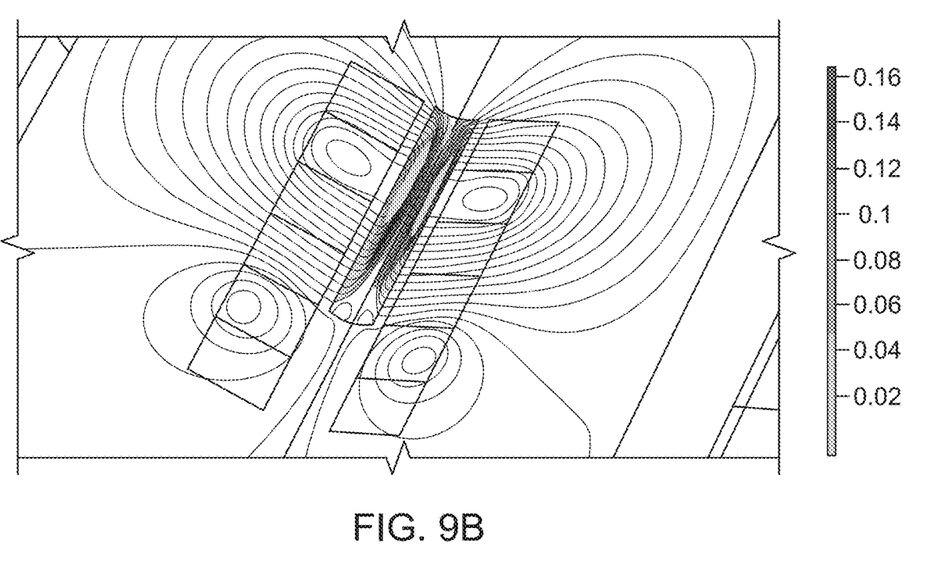
FIG. 9B is a simulation of flux density in a dense LVDT formed by plotting and rolling.

FIG. 9A shows a simulation of magnetic flux density in a conventional LVDT; FIG. 9B shows a similar simulation of magnetic flux density in a dense LVDT formed by plotting and rolling. The superior pattern of the dense LVDT concentrates the flux density more in the vicinity of the mechanical plunger.

Figure 10A:
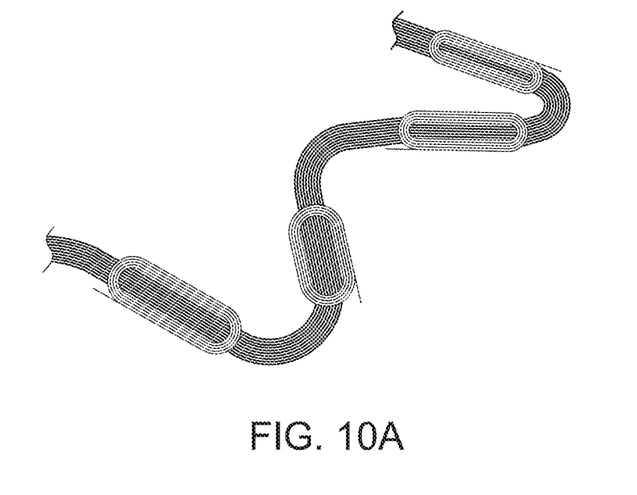
FIG. 10A shows the primary and many secondaries of a differential inductive 6-axis load cell plotted on a planar substrate.
Figure 10B:
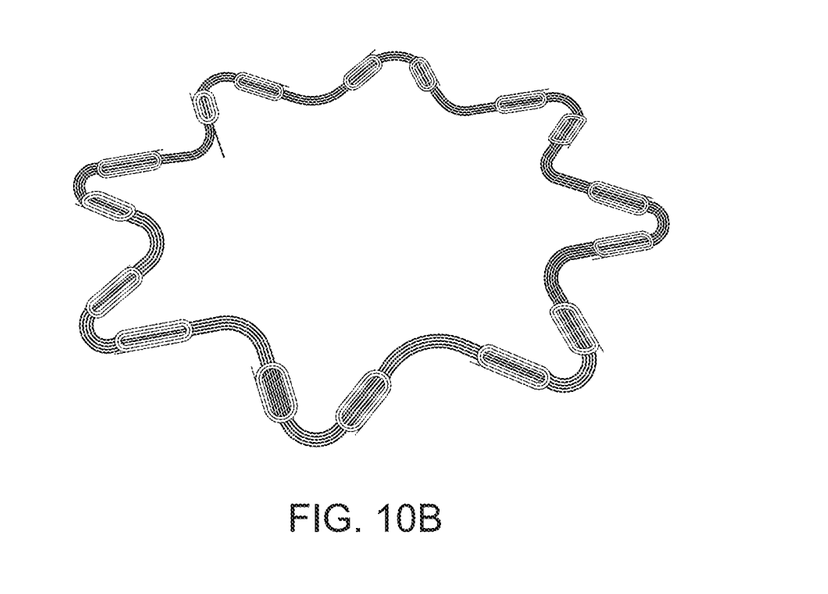
FIG. 10B shows a detail of the primary-secondary interaction.
Figure 10C:
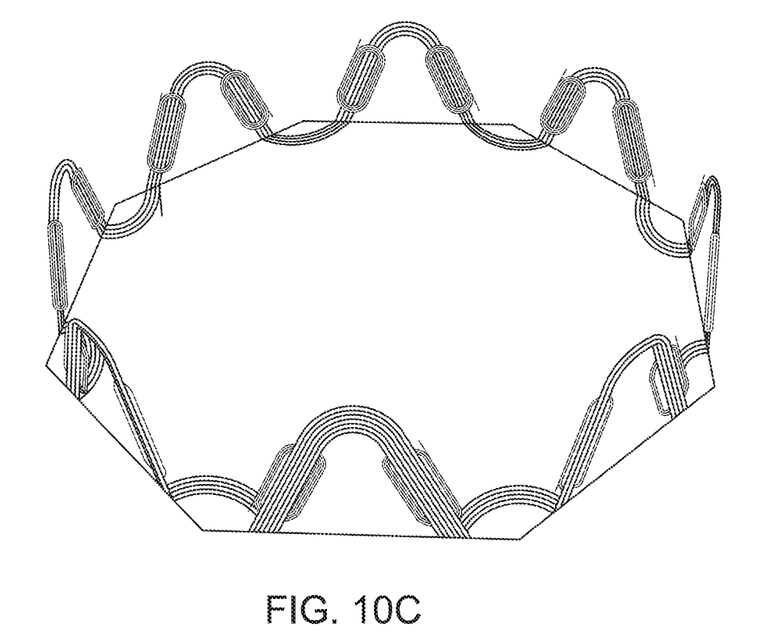
FIG. 10C shows the substrate folded vertically to orient secondaries and regions of primary.
Figure 10D:
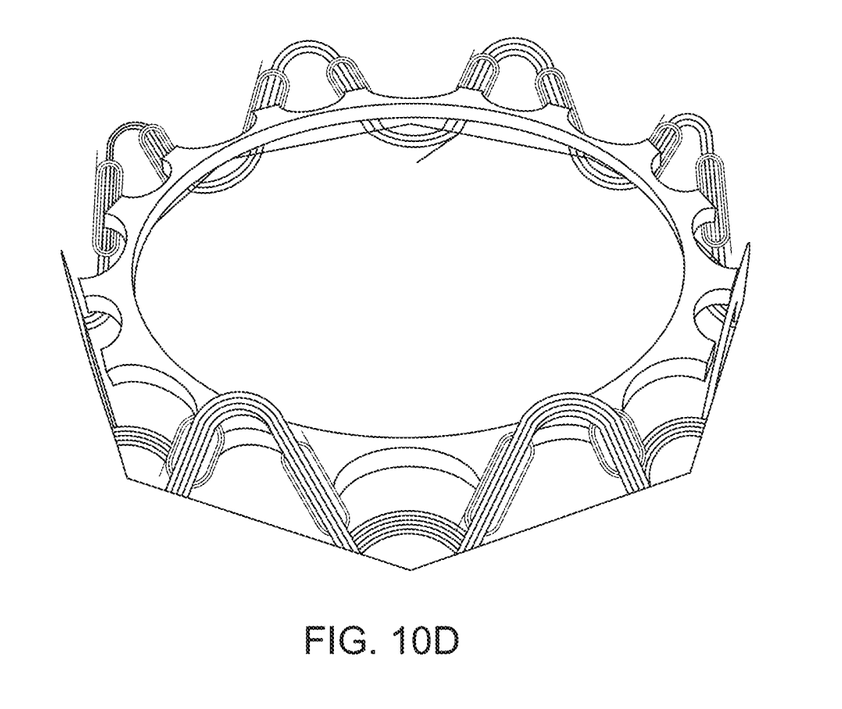
FIG. 10D shows the arrangement of FIG. 10C with a ferromagnetic core that differentially excites the secondaries based on small movements.

This technique is also well suited to incorporate multiple sensors into a monolithic part. For instance, the position and orientation of a given ferromagnetic shape can be accurately sensed using several coil sets at different locations. Conventionally, the fabrication and alignment of such a sensor array would likely negate many of the benefits, but the monolithic fabrication by planar wire plotting can quickly and accurately do this. Such an array can be used not only to sense position and orientation, but also to create a force/torque measurement device (i.e. load cell) if the ferromagnetic shape is coupled through a stiff spring or flexure. Such multiple inductive sensors can operate in opposing pairs to null unwanted signals and noise. FIGS. 10A-10B show an embodiment of a differential inductive 6-axis load cell. A single primary and arrangement of secondaries is plotted onto a planar substrate. The substrate is cut and folded so the primary has a three-dimensional shape as shown in FIG. 10C, and the secondaries are arranged to have sensitivity along a desired direction at a desired location. A ferromagnetic core is positioned to bridge the sides of each secondary as shown in FIG. 10D, giving a differential position measurement for each secondary. These measurements can be combined to estimate the six rigid degrees of freedom of the ferromagnetic core, and if the core is constrained with an appropriately designed flexure, this can be used to create the six degree-of-freedom load cell. An exemplary load cell that can suitably use the inventive sensor described herein is described in Published U.S. Patent Application number 2019/0146043 (Calisch).

Figure 11:
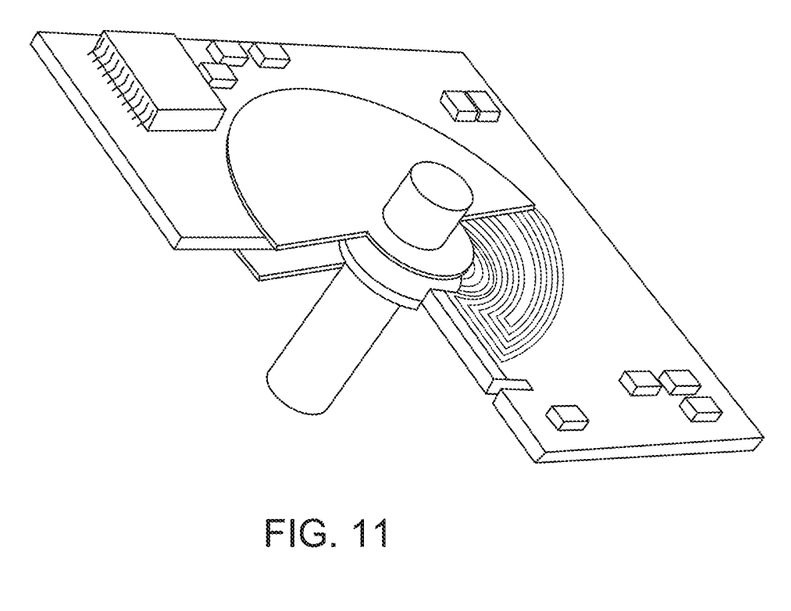
FIG. 11 shows rotary variable inductance transducer (RVIT).

The applications of this invention are not limited to LVDT-type inductive sensors, since rotary variable differential transducers as shown in FIG. 11, and resonant inductive sensors can also be made this way. Resonant inductive sensors (e.g. encoders) have shown great promise in recent years (c.f. U.S. Pat. No. 9,945,653 (Howard et al., 2018), U.S. Pat. No. 7,705,585 (Howard, 2010), achieving low cost, high-precision measurement in harsh environments by leveraging PCB manufacturing to create resonant planar conductor arrangements. These patterns rely on a significant number of vias to allow the signals to cross. These vias introduce geometric artifacts which limit the miniaturization and density of such designs. Further, PCB fabrication is subject to limits on trace width and trace separation, further limiting the achievable densities. Manufacturing these resonant encoders by plotting wire instead of PCB fabrication techniques can solve both of these problems, as trace widths and spacings can be made significantly smaller, and crossing isolated signals does not require special geometries (e.g. vias). Such increases in density and geometric accuracy can boost signal strengths and measurement accuracy, as well as reduce the requirements for magnetic shielding, allowing further cost reductions and miniaturization.

The adhesive planar substrate is generally a polymer film (e.g. Polyimide or PET of thickness 1-100 um). It is generally desirable to use as thin a film as possible, so the fraction of the volume of the resulting inductive sensor occupied by the conductors is as high as possible. Such polymer films are easily available in thicknesses down to a single micron, but handling such films is generally difficult. To aid in the handling of the plotted coil as it is manipulated into its three-dimensional form, the adhesive substrate is generally temporarily bonded to a more substantial carrier. This carrier can be composed of a variety of materials (e.g., paper products, polymers) as its main duties are to provide an inextensional support that supports the adhesive plotting substrate but easily separates from it when desired. For instance, in FIG. 5A, the carrier can be seen as the blue paperboard strip. As the adhesive substrate and coil is wound onto the bobbin, the carrier is removed and discarded. This separation can be accomplished through the use of repositionable adhesives. Another method is to use an impermeable carrier with a thin oil film deposited on top. This oil can temporarily adhere to the adhesive carrier through surface tension alone, and provide a clean separation.

Compared to conventional rigid and flexible PCB fabrication, the present invention can produce considerably better specifications for trace width and spacing. Commonly quoted minimum values for conventional processes are 0.003" (75 um) trace and 0.003" (75 um) space. Insulated wire is manufactured in a wide variety of sizes, commonly available in conductor diameters from 0.0005" (12 um) up to 0.156" (4 mm) and larger. These wires are available in a number of insulation thicknesses (called builds), depending on the application requirements (factors like abrasion resistance, dielectric strength, bondability). In single build, these insulation thicknesses can be as thin as one micron. Because the insulation rather than physical separation provides electrical isolation, these wires can be plotted so that they touch, bringing the achievable spacings down to a few microns.

Other wire materials can also be wound alongside the conductive wire. This can be advantageous to place flux guides in inductive sensors by winding ferromagnetic wire. Such wire can be made from low carbon steel (often drawn with a coating like nickel for corrosion resistance), a ferritic stainless steel (e.g. Alloy 430), Nickel, or engineered magnetic alloys (e.g. Mu-metal, which is available at a low cost in wire form). Such wire can also be drawn and insulated to eliminate eddy currents that come from a time-varying magnetic flux in such materials. Similar magnetic cores are constructed by insulating and laminating many thin sheets of steel (the insulation between sheets can be aligned with the direction of flux to eliminate eddy currents). Placing these flux guides along geometrically complex paths while linking the conductors is conventionally a complicated, difficult-to-automate task. Wire plotting flux guides alongside conductive wire provides an automated alternative.

Several descriptions and illustrations have been presented to aid in understanding the present invention. One with skill in the art will realize that numerous changes and variations may be made without deviating from the spirit of the invention. Each of these changes and variations are within the scope of the present invention.

REFERENCES

1. Hagedorn, Handbook of Coil Winding
2. U.S. Pat. No. 3,674,914
3. Published International Patent Application WO2015185879A1
4. U.S. Pat. No. 9,945,653
5. U.S. Pat. No. 7,705,585

The invention claimed is:

1. A method of coil plotting a 3-dimensional linear variable differential transformer (LVDT) sensor comprising:
   placing a pattern of wire onto a 2-dimensional planar adhesive substrate according to a predetermined 2-dimensional design using a computer-controlled plotter such that wire transfers from said plotter to adhesive on said 2-dimensional substrate during coil formation in a plane;
   manipulating the 2-dimensional substrate into a particular 3-dimensional inductor by at least one of: folding, rolling, corrugating or winding;
   whereby said adhesive supports placement accuracy of said wire.

2. The method of claim 1 further comprising using the computer-controlled plotter to perform one of cutting, creasing or scoring the 2-dimensional substrate before the step of manipulating.

3. The method of claim 1 wherein the step of placing the pattern of wire is performed at a speed of at least two meters per second of wire.

4. The method of claim 1 wherein the LVDT is formed by placing three planar coils onto the 2-dimensional substrate, and the 2-dimensional substrate is a thin film of 12 or less micron.

5. The method of claim 4 wherein one of the three planar coils is a primary, and two of the three planar coils are secondaries.

6. The method of claim 5 wherein the two secondaries are wired in opposing series configuration.

7. The method of claim 1 further comprising varying turn density as a function of position.

8. The method of claim 7 wherein the turn density is varied by changing horizontal position of turns, as well as changing vertical extent of turns.

9. The method of claim 1 wherein the 3-dimensional LVDT sensor operates as a sensor in a 6-axis load cell.

10. The method of claim 1 wherein the 3-dimensional LVDT sensor operates as a sensor in a rotary variable differential transducer.

11. The method of claim 1 wherein the 2-dimensional planar substrate is a polyimide or PET polymer film of thickness between 1 and 100 μm.

12. The method of claim 1 wherein the 2-dimensional planar substrate is temporarily bonded to a carrier, wherein the carrier is one of paper or polymer.

13. The method of claim 12 wherein the carrier is impermeable with an oil film deposited on at least one surface.

14. The method of claim 1 wherein the wire is insulated.

15. The method of claim 1 further comprising placing second wires alongside the wires in the pattern of wire.

16. The method of claim 15, wherein the second wires are one of low carbon steel, ferritic stainless steel, nickel or Mu-metal.

17. The method of claim 1 further including placing flux guides on the 2-dimensional planar substrate alongside the wires in the pattern of wire.

18. A method of coil plotting a 3-dimensional inductive LVDT sensor comprising:
   plotting a 2-dimensional wire pattern on a 2-dimensional planar adhesive substrate using a computer-controlled plotter such that wire transfers from said plotter to adhesive on said 2-dimensional substrate during coil formation in a plane, whereby said adhesive supports placement accuracy of said wire;
   manipulating the substrate into a 3-dimensional inductor wherein the 3-dimensional inductor has a predetermined magnetic flux field when energized;
   locating a ferromagnetic member in the flux field;
   attaching the ferromagnetic member to an external mechanical connection.

19. The LVDT of claim 18, wherein the 2-dimensional wire pattern has a single primary winding and a plurality of secondary windings.

20. The LVDT of claim 18, wherein the plurality of secondary windings are located equidistantly on a circumference of a circle.

* * * * *